United States Patent
Kimura

(10) Patent No.: US 12,015,497 B2
(45) Date of Patent: Jun. 18, 2024

(54) INFORMATION PROCESSING DEVICE, INFORMATION PROCESSING METHOD, COMPUTER PROGRAM, AND INFORMATION PROCESSING SYSTEM

(71) Applicant: SONY GROUP CORPORATION, Tokyo (JP)

(72) Inventor: Ryota Kimura, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/042,181

(22) PCT Filed: Jul. 29, 2021

(86) PCT No.: PCT/JP2021/028153
§ 371 (c)(1),
(2) Date: Feb. 17, 2023

(87) PCT Pub. No.: WO2022/044684
PCT Pub. Date: Mar. 3, 2022

(65) Prior Publication Data
US 2024/0031189 A1    Jan. 25, 2024

(30) Foreign Application Priority Data
Aug. 26, 2020   (JP) ................................ 2020-142913

(51) Int. Cl.
*H04L 12/18*   (2006.01)
*H04L 67/1087*  (2022.01)

(52) U.S. Cl.
CPC ...... *H04L 12/1868* (2013.01); *H04L 67/1093* (2013.01); *H04L 12/189* (2013.01)

(58) Field of Classification Search
None
See application file for complete search history.

(56) References Cited

U.S. PATENT DOCUMENTS

| | | | |
|---|---|---|---|
| 2013/0208627 A1* | 8/2013 | Picard .................... | G01D 4/006 370/255 |
| 2019/0036717 A1* | 1/2019 | Kebler .................... | H04L 45/22 |
| 2021/0258106 A1* | 8/2021 | Rozenberg .......... | H04L 12/1868 |

FOREIGN PATENT DOCUMENTS

| | | |
|---|---|---|
| CN | 106529951 A | 3/2017 |
| JP | 11-196037 A | 7/1999 |

(Continued)

OTHER PUBLICATIONS

Chawla, et al., "Velocity: Scalability Improvements in Block Propagation Through Rateless Erasure Coding", IEEE, International Conference on Blockchain and Cryptocurrency (ICBC), May 14, 2019, 08 pages.

(Continued)

*Primary Examiner* — Angela Nguyen
(74) *Attorney, Agent, or Firm* — CHIP LAW GROUP

(57) ABSTRACT

There are provided an information processing device, an information processing method, a computer program, and an information processing system that implement effective and highly reliable communication using a distributed network that manages the same data in a distributed manner by a plurality of devices. An information processing device of the present disclosure includes an encoding unit that generates redundant data of target data by encoding the target data, and a communication unit that broadcasts or multicasts the target data and the redundant data to a distributed network that manages the target data in a distributed manner by a plurality of devices.

18 Claims, 18 Drawing Sheets

(56) References Cited

FOREIGN PATENT DOCUMENTS

| | | |
|---|---|---|
| JP | 2007-507966 A | 3/2007 |
| JP | 2014-068337 A | 4/2014 |
| WO | 2020/035087 A2 | 2/2020 |

OTHER PUBLICATIONS

International Search Report and Written Opinion of PCT Application No. PCT/JP2021/028153, dated Sep. 28, 2021, 08 pages of ISRWO.

* cited by examiner

INFORMATION PROCESSING DEVICE, INFORMATION PROCESSING METHOD, COMPUTER PROGRAM, AND INFORMATION PROCESSING SYSTEM

CROSS REFERENCE TO RELATED APPLICATIONS

This application is a U.S. National Phase of International Patent Application No. PCT/JP2021/028153 filed on Jul. 29, 2021, which claims priority benefit of Japanese Patent Application No. JP 2020-142913 filed in the Japan Patent Office on Aug. 26, 2020. Each of the above-referenced applications is hereby incorporated herein by reference in its entirety.

TECHNICAL FIELD

The present disclosure relates to an information processing device, an information processing method, a computer program, and an information processing system.

BACKGROUND ART

As a technology for achieving a distributed ledger, a blockchain is used for management of transaction data of settlement, remittance, and the like of virtual currency and cryptocurrency. In the future, there is a possibility that applications using the blockchain will increase in addition to the virtual currency and the cryptocurrency. For example, distribution tracing, right processing (for example, copyright, land rights), sharing of monitoring data, and the like can be considered.

Some applications that use blockchains may require communication over a wireless network. In a wireless network, there is a concern that the radio wave environment becomes unstable, but it is required that blockchain messages can be stably transmitted and received regardless of the state of the wireless environment. In particular, in a system using the blockchain, it is required that exchange of messages such as transactions and approval data is performed on a broadcast or multicast basis, and broadcast or multicast can be stably performed. In a device that cannot receive a message transmitted by broadcast or multicast, the blockchain cannot be updated, and consequently, the blockchain is divided (or branched).

Patent Document 1 below discloses an encoding device that maintains data confidentiality. In this encoding device, data to be stored is divided, and each data portion is subjected to error encoding to acquire a redundant portion. Each redundant portion is regenerated and encoded, and a plurality of pieces of reproduction encoded data is stored in separate storage devices. At the time of decoding, the reproduction encoded data is read from some of the plurality of storage devices and decoded to obtain a redundant portion. A data portion is restored from each redundant portion. According to this, when the number of storage devices from which information is leaked is equal to or smaller than a threshold, the data portion cannot be restored from the leaked information, and thus original data is kept secret.

In a case where the technology disclosed in Patent Document 1 is applied to a blockchain system, it is conceivable to store a plurality of pieces of reproduction encoded data generated from a message in different devices. However, since the same information cannot be shared by the respective devices, the technology of Patent Document 1 is not effective in the blockchain system.

CITATION LIST

Patent Document

Patent Document 1: Japanese Patent Application Laid-Open No. 2014-68337

SUMMARY OF THE INVENTION

Problems to be Solved by the Invention

The present disclosure provides an information processing device, an information processing method, a computer program, and an information processing system that achieve effective and highly reliable communication using a distributed network that manages the same data in a distributed manner by a plurality of devices.

Solutions to Problems

An information processing device of the present disclosure includes an encoding unit that generates redundant data of target data by encoding the target data, and a communication unit that broadcasts or multicasts the target data and the redundant data to a distributed network that manages the target data in a distributed manner by a plurality of devices.

An information processing method of the present disclosure includes generating redundant data of target data by encoding the target data, and broadcasting or multicasting the target data and the redundant data to a distributed network that manages the target data in a distributed manner by a plurality of devices.

A computer program of the present disclosure causes a computer to execute generating redundant data of target data by encoding the target data, and broadcasting or multicasting the target data and the redundant data to a distributed network that manages the target data in a distributed manner by a plurality of devices.

An information processing system of the present disclosure includes a first information processing device including an encoding unit that generates redundant data of target data by encoding the target data, and a communication unit that broadcasts or multicasts the target data and the redundant data to a distributed network that manages the target data in a distributed manner by a plurality of devices, and a second information processing device including a receiving unit that receives the target data and the redundant data from the distributed network, and a decoding unit that restores the target data on the basis of the redundant data in a case where the target data is lost or in a case where an error is detected in the target data.

MODE FOR CARRYING OUT THE INVENTION

Hereinafter, embodiments of the present disclosure will be described with reference to the drawings. In one or more embodiments illustrated in the present disclosure, elements included in each embodiment can be combined with each other, and a result of the combination also forms a part of the embodiments illustrated in the present disclosure.

Figure 1:
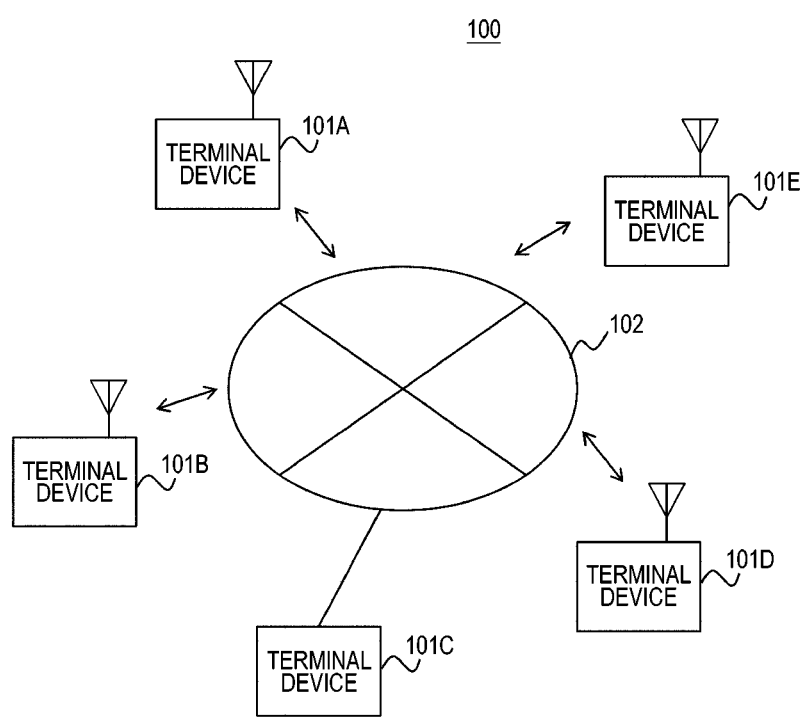
FIG. 1 is a block diagram of a distributed network including an information processing system according to a first embodiment of the present disclosure.

FIG. 1 is a block diagram of a distributed network including a blockchain system which is an information processing system according to a first embodiment of the present disclosure. A distributed network (blockchain system) 100 in FIG. 1 includes a plurality of terminal devices 101A, 101B, 101C, 101D, and 101E, and a communication network 102 that connects the plurality of terminal devices 101A to 101E. Any one terminal device among the plurality of terminal devices 101A to 101E will be referred to as a terminal device 101. The communication network 102 is a wireless network, a wired network, or a mixed network of wireless and wired networks. The terminal devices 101A, 101B, 101C, and 101D are wirelessly connected to the communication network 102 to perform communication. The terminal device 101C is connected to the communication network 102 by wire and performs communication. All terminal devices may be connected to the communication network 102 wirelessly or by wire. The communication network 102 may be any network such as a wireless local area network (LAN), a mobile network, or the Internet. Furthermore, the communication network 102 may be a network in which a plurality of types of networks is mixed.

Figure 2:
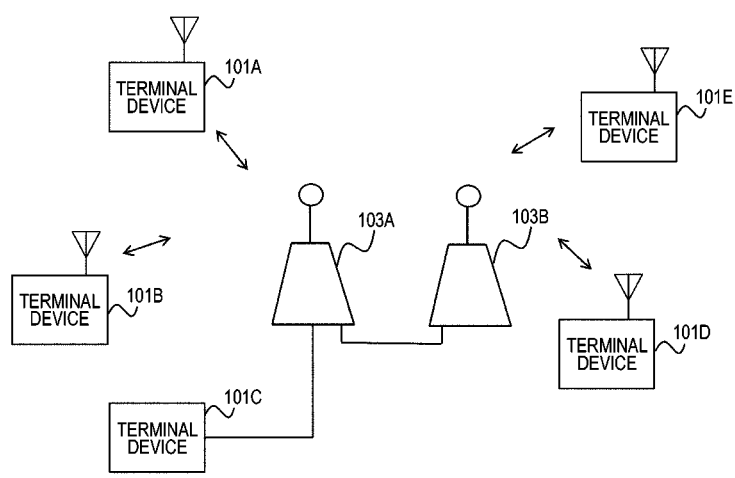
FIG. 2 is a diagram illustrating an example of a communication network used for the distributed network.

FIG. 2 illustrates an example of the communication network 102. The communication network 102 includes a plurality of base stations 103A and 103B. The base station 103A wirelessly communicates with the terminal devices 101A and 101B, and communicates with the terminal device 101C by wire. The base station 103B wirelessly communicates with the terminal devices 101E and 101D. The base station 103A and the base station 103B are connected by wire. The base stations 103A and 103B transmit a packet received from a terminal device within the coverage of their own station to a destination terminal device within the coverage, or relay the packet to the other base station according to the destination of the packet. In a case where the destination address is a broadcast address or a multicast address, the packet is transmitted to all the other terminal devices or a terminal device group of a specific group in the coverage, and the packet is relayed to the other base station. The base station that receives the relayed packet transmits the packet to all the terminal devices or a terminal device group of a specific group in the coverage. In the example of FIG. 2, the base stations 103A and 103B are connected by wire, but may be connected wirelessly.

The distributed network 100 in FIG. 1 or 2 distributes and manages target data that is the same data among the terminal devices 101A to 101E by a blockchain that is a technology for achieving a distributed ledger. That is, saving, recording, holding, storing, or the like of the same data is performed among the terminal devices 101A to 101E by the blockchain. An application (blockchain program) that achieves the blockchain is installed in the terminal devices 101 to 101E, and information processing is performed in each terminal device so that the blockchain is correctly achieved by each terminal device executing the application. Regardless of the physical configuration of the communication network 102, communication related to the blockchain is performed between terminal devices in an application layer.

Figure 3:
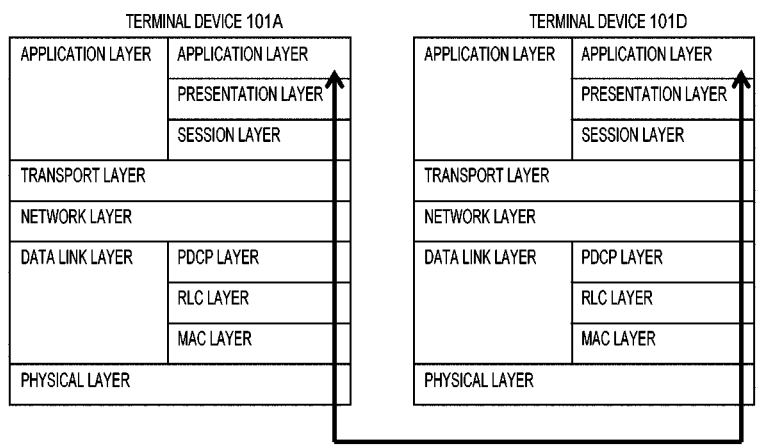
FIG. 3 is a diagram illustrating blockchain communication from a viewpoint of a protocol stack.

FIG. 3 is a diagram illustrating that blockchain communication is performed among application layers of a plurality of terminal devices from the viewpoint of a protocol stack. Although application communication between the terminal device 101A and the terminal device 101D is illustrated as an example, application communication is similarly performed between other terminal devices. All layers higher than a transport layer may be an application layer, or the layers higher than the transport layer may be divided into a session layer, a presentation layer, and an application layer. A data link layer includes a packet data convergence protocol (PDCP) layer, a radio link control (RLC) layer, and a medium access control (MAC) layer. The configuration of the data link layer is an example, and other configurations are also possible.

Here, the technical background of the present embodiment will be described. In the blockchain communication, for example, a terminal device receives a broadcast or multicast transaction from another terminal device. The terminal device performs processing of generating a block including one or more transactions and acquiring approval based on a consensus algorithm for the generated block. Upon acquiring the approval, the terminal device broadcasts or multicasts approval data including information regarding an approved block. Furthermore, the terminal device receives the approval data from the distributed network, and performs processing of updating the blockchain by adding the approved block to the blockchain. By adding the block approved in this way, the same blockchain is maintained in each terminal device. When the communication quality decreases due to the radio wave environment of the communication network 102, a terminal device that cannot correctly receive the approval data or the transaction may occur, and this terminal device may not be able to add a block. The terminal device cannot own the same blockchain as another terminal device, and the blockchain is divided (or branched). In this case, for example, the longest blockchain is employed by the consensus algorithm, and the terminal device acquires information of the longest blockchain from another node. For this reason, there is a possibility that the update of the blockchain is delayed. The update of the blockchain will be described below with reference to FIG. 4.

Figure 4:
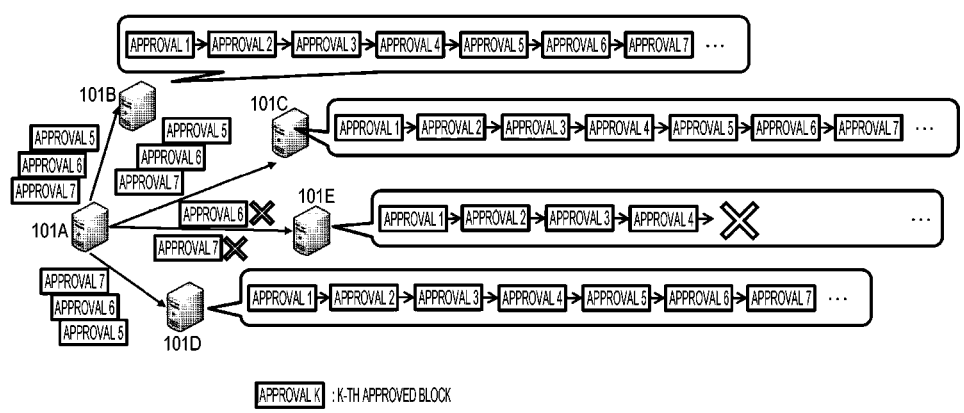
FIG. 4 is a diagram schematically illustrating a state of adding an approved block to a blockchain.

FIG. 4 schematically illustrates a state in which the approval data including information regarding the approved block is broadcast or multicast from the terminal device 101A, and the approved block is added to the blockchain by the terminal devices 101B to 101E. In the terminal devices 101B to 101D, blocks (first to seventh blocks and subsequent blocks) related to all the broadcasted or multicast approval data have been added to the blockchain. On the other hand, since the terminal device 101E could not acquire the approval data related to the fifth block, the fifth and subsequent blocks could not be added to the blockchain, and the blockchain is divided.

The present embodiment provides a mechanism capable of correctly transmitting and receiving data (transaction, approval data, and the like) related to the blockchain even in a case where the communication quality is unstable due to the radio wave environment of the communication network 102, thereby achieving stable operation of the blockchain.

Hereinafter, before describing the details of the present embodiment, an outline of a procedure related to transaction and block approval related to the blockchain will be described. Note that the blockchain according to the present embodiment includes various data or algorithms referred to as a distributed ledger, a distributed database, a de-centralized ledger, a de-centralized database (de-centralized ledger), Bitcoin Core, Ethereum, or Hyperledger Fabric.

Figure 18:
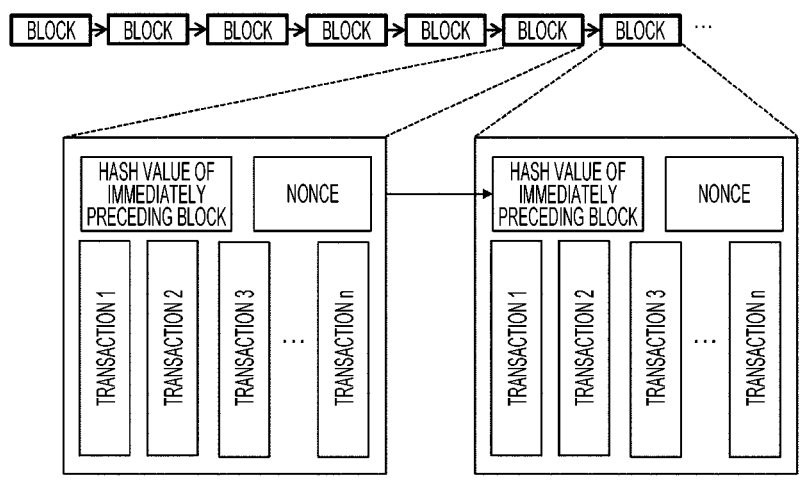
FIG. 18 is a diagram illustrating an outline of the blockchain.

FIG. 18 is a diagram illustrating an outline of a blockchain. The blockchain is data in which a plurality of blocks is connected like a chain. Each block includes one or two or more transactions 1 to n (n is an integer of 1 or more). Furthermore, each block includes, as an example, a hash value of the immediately preceding block and a value called a nonce. Other information, for example, hash values of all transactions included in the block may be included.

The hash value of the immediately preceding block is information used to determine whether or not a block continuous from the immediately preceding block is a valid block correctly continuous from the immediately preceding block. In a case where a transaction included in a certain block is deleted or tampered with, the hash value of the block changes, and the consistency with the hash included in the immediately subsequent block is lost, so that deletion and tampering of the transaction can be detected. As a hash function for generating the hash value, there is SHA-256 (in this case, the hash value is a fixed 256 bit) or the like. However, the type of the hash function is not particularly limited.

The nonce is information used to prevent impersonation in authentication using the hash value. By using the nonce, tampering is prevented. As the nonce, for example, a character string, a numeric string, or data indicating a combination thereof, or the like can be used.

In this example, it is assumed a case where proof of work (POW) is used as a consensus building algorithm in the blockchain system, but the type of algorithm is not particularly limited.

Furthermore, an electronic signature using an encryption key is assigned to each transaction. This prevents impersonation. Each transaction is published and shared throughout the blockchain network. Note that each transaction may be encrypted using an encryption key.

Figure 19:
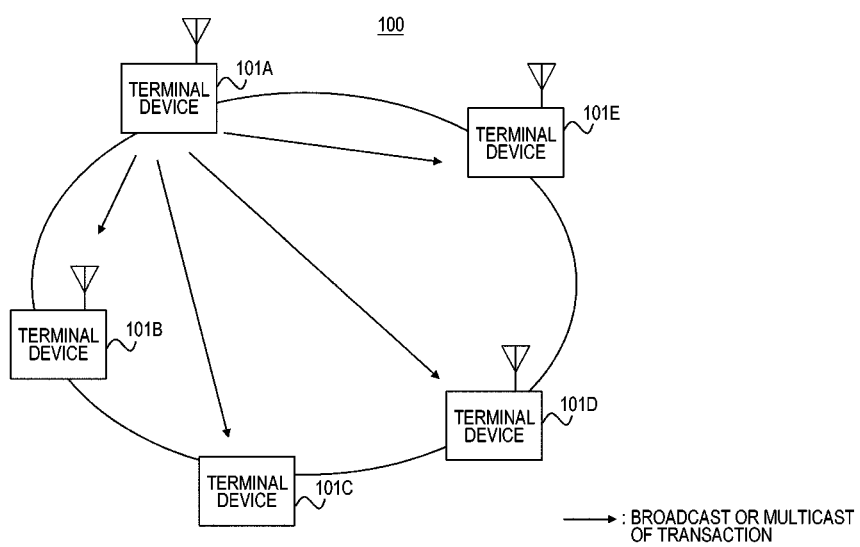
FIG. 19 is a diagram schematically illustrating an example in which a user A registers target data included in a transaction.

FIG. 19 schematically illustrates an example in which a user A registers target data (for example, a remittance request of 10 bitcoins (BTC) from the user A to a user D) of a transaction in the blockchain system of FIG. 1. The user A is a user of the terminal device 101A. The user A adds an electronic signature generated using a secret key of the user A to the target data to be registered in the blockchain. By adding the electronic signature, it is ensured that the holder of the target data is the user A. The terminal device 101A of the user A broadcasts or multicasts a transaction including the target data to which the electronic signature is added to the blockchain network. The broadcast or multicast transaction is received by the terminal device 101B to the terminal device 101E. The transaction may include the public key of the transmission target user D.

The terminal devices 101B to 101E store the transaction received from the terminal device 101A in an internal storage unit. The terminal devices 101B to 101E designate one or more transactions to be included in a new block from among transactions stored in the storage unit, and perform processing related to generation of the new block. At this time, the validity of the generation source of the transactions is authenticated on the basis of the electronic signature added to the transactions.

The terminal devices 101B to 101E perform a procedure for obtaining approval of a block to be newly generated as processing related to consensus building in the blockchain system. The terminal devices 101B to 101E add the designated transaction, the hash value of the previous block, and the nonce to a newly generated block. The nonce adds, for example, the hash value of the immediately preceding block, the hash values of all the designated transactions, and the parameter, and inputs a value after the addition to a predetermined hash function. A parameter in which a hash value that is an output value of the hash value satisfies a predetermined condition is searched for, and the found parameter is employed as the nonce. As a predetermined condition, the hash value may be equal to or less than a threshold. In a case where the nonce satisfying a predetermined condition has been found, an approval request including information regarding the block (such as information specifying the content of the block or the block itself) is broadcast or multicast to the blockchain system 100. That is, the terminal device that first finds the nonce satisfying the predetermined condition broadcasts or multicasts the approval request.

Figure 20:
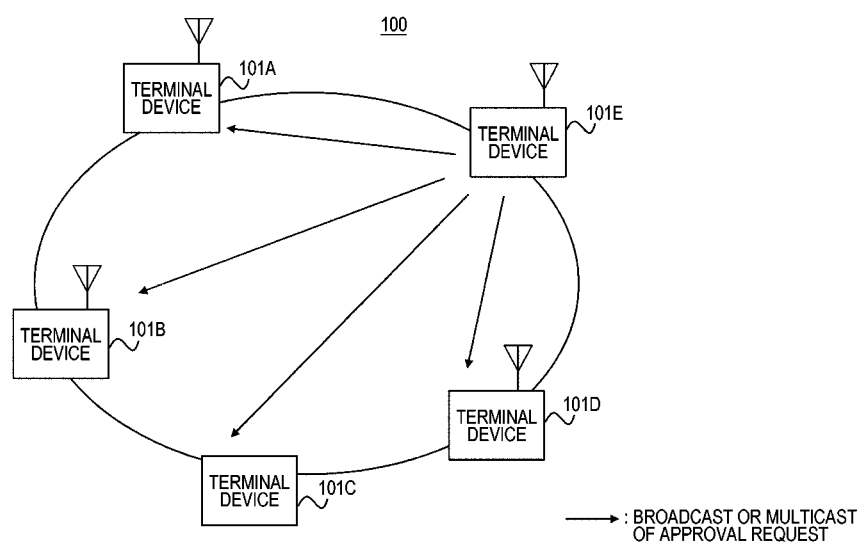
FIG. 20 is a diagram illustrating an example of broadcasting or multicasting an approval request.

FIG. 20 illustrates an example in which the terminal device 101E first finds a nonce satisfying a predetermined condition and broadcasts or multicasts an approval request. Upon obtaining approval from a certain number or more of the other terminal devices, the terminal device 101E formally adds a new block to the blockchain. The content of approval processing performed by the other terminal devices includes, for example, processing of confirming that the nonce is appropriate. Upon obtaining approval of the other terminal devices, the terminal device 101E generates approval data including information regarding the block for which the approval has been obtained. The terminal device 101E broadcasts or multicasts the approval data. Upon receiving the approval data including the information regarding the block for which the approval has been obtained from the terminal device 101E, the other terminal devices 101A to 101D newly add the block for which the approval has been obtained to the blockchain. Alternatively, the other terminal devices 101A to 101D may add an approved block to the blockchain at a time point when the other terminal devices perform the approval processing in their own devices and confirm that the nonce is appropriate.

Figure 5:
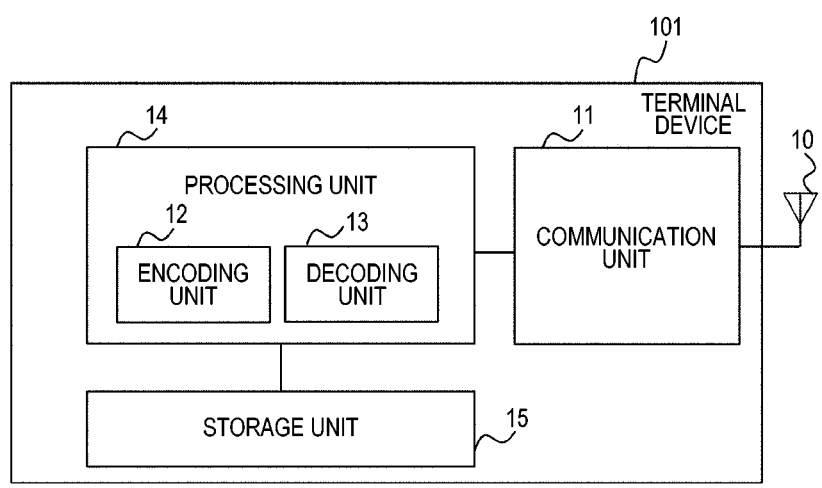
FIG. 5 is a block diagram of a terminal device including an information processing device according to an embodiment of the present disclosure.

FIG. 5 is a block diagram of a terminal device 101 including the information processing device according to the embodiment of the present disclosure. The terminal device 101 includes an antenna 10, a communication unit 11, a processing unit 14, and a storage unit 15. The processing unit 14 includes an encoding unit 12 and a decoding unit 13. FIG. 5 illustrates a configuration in a case where the terminal device 101 performs wireless communication, but the antenna 10 may not be provided in a case where wired communication is performed.

The processing unit 14 performs various processes related to the blockchain by executing a program (application) related to the blockchain. The processing unit 14 generates a transaction which is an example of the target data according to the present embodiment. For example, the processing unit 14 generates a transaction using detection of a predetermined event such as an operation input of the user as a trigger. The transaction may be data input by the user, data detected by the sensing device, or other data. The processing unit 14 stores the generated transaction in the storage unit 15. Furthermore, the processing unit 14 encodes the generated transaction as a message using the encoding unit 12, and broadcasts or multicasts the encoded message to the distributed network 100 via the communication unit 11. The encoded message is transmitted as a packet in a format according to a protocol to be used, and the destination address of the packet is a broadcast address or a multicast address. It is also possible to broadcast or multicast the transaction data without encoding the transaction.

The encoding unit 12 generates coded data by encoding the target data according to the present embodiment. For example, a transaction generated by the processing unit 14, approval data to be described later, or the like is encoded as a message on the basis of an encoding method to generate the encoded message. Examples of the code used in the coding method include erasure codes, rateless codes, fountain codes, tornado codes, Luby transform (LT) codes, raptor codes, raptor Q codes, low density parity check (LDPC) codes, Bose-Chaudhuri-Hocquenghem (BCH) codes, Reed-Solomon (RS) codes, exclusive or (XOR) codes, or the like. Details of encoding by the encoding unit 12 will be described later.

Upon receiving an encoded message transmitted (for example, broadcast or multicast) from another terminal device 101, the processing unit 14 decodes the encoded message using the decoding unit 13 and acquires a decoded message. In a case where the acquired message is a transaction, the processing unit 14 stores the acquired transaction in the storage unit 15.

The decoding unit 13 decodes the received encoded message on the basis of a decoding system corresponding to the encoding system, and acquires a decoded message (transaction, approval data, or the like).

The storage unit 15 stores various kinds of information or data. The storage unit 15 stores a blockchain program or the like that achieves each function of the terminal device 101 (information processing device). The processing unit 14 executes the blockchain program stored in the storage unit 15, thereby implementing various types of processing for achieving the blockchain.

Furthermore, the storage unit 15 stores a transaction generated by the processing unit 14 and also stores a transaction received from another terminal device 101.

Furthermore, the storage unit 15 stores a blockchain that is a set of data (blocks) shared by terminal devices (information processing devices) participating in the blockchain system. The terminal device acquires information of the blockchain via the distributed network 100, and updates the blockchain while maintaining consistency with the blockchain held by another terminal device 101.

The processing unit 14 performs processing related to generation of a new block to be added to the blockchain. The processing unit 14 starts generation processing of the new block at a predetermined timing. The predetermined timing may be, for example, immediately after the processing unit 14 has generated a block that has been generated immediately before, or after a predetermined time has elapsed since the block has been generated immediately before. Alternatively, the predetermined timing may be a timing determined by using an operation input of the user as a trigger, or may be another timing.

The processing unit 14 designates a transaction to be included in the new block from among transactions stored in the storage unit 15 as processing related to the generation of the new block. For example, the processing unit 14 may designate a transaction of one or more predetermined items as the transaction to be included in the new block. Alternatively, a transaction until reaching a predetermined data size may be designated as the transaction to be included in the new block. The transaction to be included in the new block may be designated by another method.

For a newly generated block, the processing unit 14 performs a procedure for obtaining approval of the block as processing related to consensus building in the blockchain system. Examples of approval algorithms include proof of work (POW), proof of stake (POS), proof of importance (POI), proof of consensus (POC), proof of burn (POB), Practical Byzantine Fault Tolerance (PBFT), and the like. In a case of the POW, the processing unit 14 adds, for example, the designated transaction, the hash value of the immediately preceding block, and the nonce to the newly generated block. At this time, the processing unit 14 searches for the nonce in which the hash value input to and output from the predetermined hash function satisfies a predetermined condition, and adds the nonce satisfying the predetermined condition. The processing unit 14 adds the new block to the blockchain, and broadcasts or multicasts an approval request including information regarding the block (information specifying the content of the block, the block itself, or the like) to the distributed network 100. Thereafter, for example, when approval by a certain number or more of the other terminal devices is obtained, the new block is officially added to the blockchain. The content of the approval processing performed by the other terminal device 101 includes, for example, processing of confirming that the nonce is appropriate. The processing unit 14 may generate the encoded message by encoding the approval request by the encoding unit 12, and broadcast or multicast the encoded message.

Upon obtaining the approval, the processing unit 14 generates approval data including information regarding the block for which the approval has been obtained. The processing unit 14 encodes the approval data using the encoding unit 12, and broadcasts or multicasts the encoded message obtained by the encoding. The encoded message is transmitted in a packet in the format according to the protocol to be used. The destination address of the packet is a broadcast address or a multicast address. It is also possible to broadcast or multicast the approval data without encoding the approval data.

In a case of receiving the approval data including information regarding the block for which approval has been obtained from another terminal device 101, the processing unit 14 newly adds the block for which the approval has been obtained to the blockchain.

Furthermore, for example, in a case where the approval algorithm is POW, when the approval request is received from another terminal device 101, the processing unit 14 performs the approval processing, and transmits an approval response including a result of the approval processing to the terminal device 101 that is the transmission source of the approval request. The processing unit 14 may encode the approval request using the encoding unit 12 to obtain an encoded message and transmit the encoded message. In a case of approving the block as a result of the approval processing, the processing unit 14 may add the block to the blockchain at the time of approval. In this case, the approval data may not be received from another terminal device 101.

The communication unit 11 transmits and receives encoded messages, various data, and messages via the antenna 10. Specifically, the communication unit 11 broadcasts or multicasts a transaction or an encoded message obtained by encoding the transaction. Furthermore, in the case of POW, for example, the communication unit 11 may transmit an approval request for obtaining approval of a newly generated block or an encoded message obtained by encoding the approval request. This transmission may be broadcast or multicast. The communication unit 11 receives a broadcast or multicast encoded message (for example, an encoded message of a transaction, an encoded message of an approval request, an encoded message of approval data, or the like) from another terminal device 101. The communication unit 11 transmits and receives various data or messages that are not to be encoded and decoded by the encoding unit 12 and the decoding unit 13.

The processing of each layer of the protocol stack is performed by at least one of the processing unit 14 and the communication unit 11 as an example. As an example, the processing unit 14 may perform an application layer, a presentation layer, and a session layer, and the communication unit 11 may perform processing of the transport layer and lower layers. Alternatively, all the layers may be processed by the processing unit 14, and the communication unit 11 may perform only processing related to conversion between the packet of a physical layer and a wireless signal (modulation/demodulation, band limitation, AD/DA conversion, amplification, or the like). The block in which the processing of each layer is performed may be determined by another method.

Figure 6:
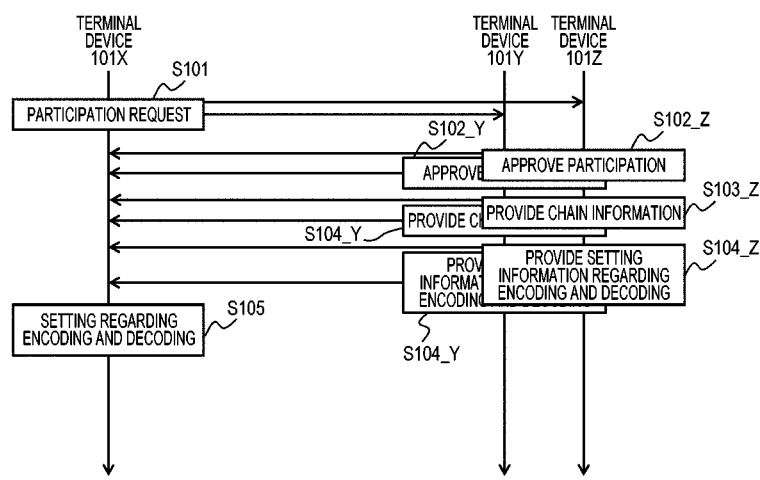
FIG. 6 is a diagram illustrating a sequence example of participation in a blockchain system.

FIG. 6 illustrates a sequence example of participation in the blockchain system (information processing system). In a case where the terminal device 101X participates in the blockchain system, it is necessary to obtain participation approval from the terminal device having the authority to approve the participation. The terminal device 101X transmits a message of participation request to an authorized terminal device (in this example, the terminal devices 101Y and 101Z) via the communication network 102 (S101). When determining to approve the participation of the terminal device 101X, the terminal devices 101Y and 101Z transmit a message of participation approval to the terminal device 101X via the communication network 102 (S102_Y and S102_Z). Furthermore, the terminal devices 101Y and 101Z transmit messages including the information of the blockchain held by the terminal devices 101Y and 101Z to the terminal device 101X via the communication network 102 (S103_Y and S103_Z). Furthermore, the terminal devices 101Y and 101Z transmit messages including setting information regarding encoding and decoding of at least one of the transaction, the approval request, and the approval data to the terminal device 101X via the communication network 102 (S104_Y and S104_Z).

Upon receiving the message of participation approval, the terminal device 101X determines that the participation in the blockchain system has been approved. The terminal device 101X stores the blockchain in the storage unit 15 on the basis of the information of the blockchain received from the terminal devices 101Y and 101Z. As an example, the blockchain indicated by the information received earliest is stored in the storage unit 15. In a case where the blockchains received from the terminal devices 101Y and 101Z are different, for example, a longer blockchain may be employed and the employed blockchain may be stored. Furthermore, the terminal device 101X stores setting information regarding encoding and decoding related to at least one of the transaction, the approval request, and the approval data in the storage unit 15 on the basis of the setting information received from the terminal devices 101Y and 101Z (S105). The setting information regarding the encoding includes information of an encoding method of transaction and a decoding method of transaction. The setting information regarding the approval request or the approval data includes information of an encoding method and a decoding method of the approval request or the approval data. The encoding method and decoding method of the approval request or the approval data and the encoding and decoding method of the transaction may be the same or different. It is assumed that the setting information received from the terminal devices 101Y and 101Z is the same, and either one of the setting information is stored. However, a case where the setting information received from the terminal devices 101Y and 101Z is different may be allowed. In this case, a terminal device group to be the application range is designated in the setting information, and the terminal device 101X may use the encoding method and the decoding method depending on the terminal device group of the communication destination.

In the example of FIG. 6, there are two terminal devices having authority, but the number of terminal devices having authority may be one or three or more. Furthermore, although the participation approval, the information of the blockchain, and the setting information are transmitted in separate messages, the participation approval, the information of the blockchain, and the setting information may be transmitted in the same single message.

Figure 7:
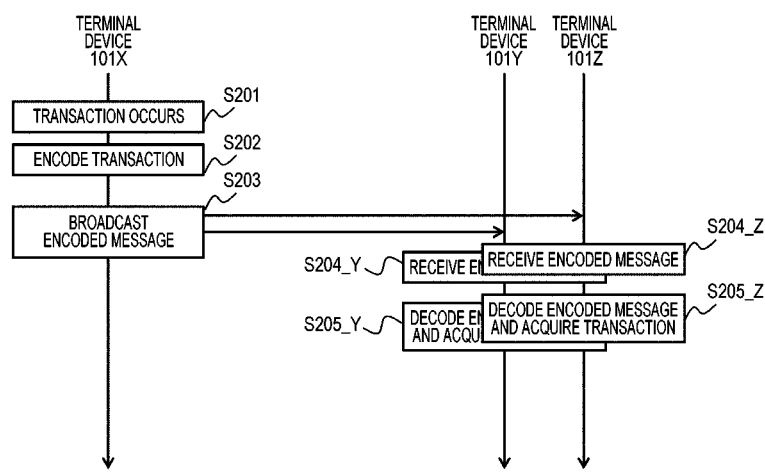
FIG. 7 is a sequence diagram of an example of a procedure related to encoding and decoding of a transaction.

FIG. 7 is a sequence diagram of an example of a procedure related to encoding and decoding of a transaction. The terminal device 101X generates a transaction which is data (target data) to be registered in the blockchain (S201). The terminal device 101X generates an encoded message by encoding the generated transaction (S202). In this example, encoding is performed at the application layer. However, as will be described later, the layer that performs encoding may be other layers such as a data link layer and a transport layer. The terminal device 101X broadcasts an encoded message related to the transaction (S203). However, it is also possible to perform multicasting instead of broadcasting.

The encoded message broadcast from the terminal device 101X is received by the terminal devices 101Y and 102Z (S204_Y and S204_Z). Although the encoded message is received by the terminal devices other than the terminal devices 101Y and 102Z, attention is paid here to the terminal devices 101Y and 102Z. The terminal devices 101Y and 102Z decode the received encoded message by a decoding method corresponding to the encoding method used for the transaction (S205_Y and S205_Z). In this example, the transaction is encoded at the application layer, and the decoding is also performed at the application layer. The terminal devices 101Y and 102Z store the decoded transaction in the storage unit 15.

Figure 8:
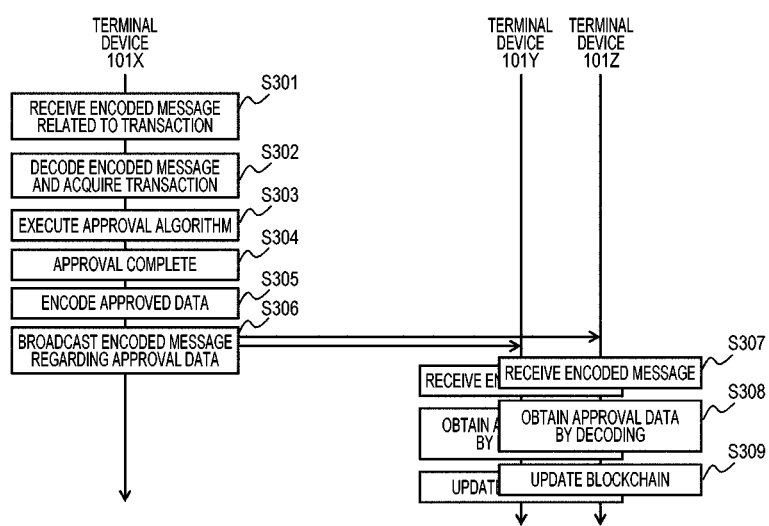
FIG. 8 is a sequence diagram of an example of a procedure related to encoding and decoding of approval data.

FIG. 8 is a sequence diagram of an example of a procedure related to encoding and decoding of the approval data. The terminal device 101X receives an encoded message related to a transaction from another terminal device (S301). The another terminal device may be the terminal device 101_Y or the terminal device 101_Z, or may be a terminal device other than the terminal devices 101_Y and 102_Z. The terminal device 101X decodes the received encoded message by a decoding method corresponding to the encoding method used for encoding the transaction (S302). In this example, the transaction is encoded at the application layer, and the transaction is also decoded at the application layer. The terminal device 101X stores the decoded transaction in the storage unit 15. Steps S301 and S302 are similar to steps S204_Y, S204_Z, S205_Y, and S205_Z in FIG. 7.

The terminal device 101X designates at least one transaction to be newly included in a block from the storage unit 15, and generates a block including the designated transaction and other information. The terminal device 101X obtains approval of the block on the basis of the approval algorithm that is a consensus building algorithm (S303). At this time, an encoded message may be generated by encoding an approval request for obtaining approval of the block, and the encoded message may be broadcast or multicast. Upon obtaining the block approval (S304), the terminal device 101X generates the approval data including information of the approved block, and generates the encoded message by encoding the approval data (S305). The encoding is performed at the application layer in this example. The terminal device 101X broadcasts the encoded message (S306). However, it is also possible to multicast the encoded message instead of broadcasting. The layer that encodes the approval request or the approval data may be other layers such as the data link layer and the transport layer.

The encoded message broadcast from the terminal device 101X is received by the terminal devices 101Y and 102Z (S307_Y and S307_Z). Although the encoded message is received by the terminal devices other than the terminal devices 101Y and 102Z, attention is paid here to the terminal devices 101Y and 102Z. In a case of receiving the encoded message of the approval request, the terminal devices 101Y and 102Z decode the received encoded message, acquire the approval request, and perform the approval processing of the block. Furthermore, the terminal devices 101Y and 102Z decode the encoded message of the approval data to obtain the approval data (S308_Y and S308_Z). The terminal devices 101Y and 101Z specify the approved block on the basis of the approval data and add the specified block to the blockchain (S309). Thus, the blockchain is updated.

Hereinafter, a specific example of encoding performed in the terminal device 101 will be described. Although an example of encoding a transaction is illustrated, the same applies to the case of the approval data or the approval request.

Figure 9A:
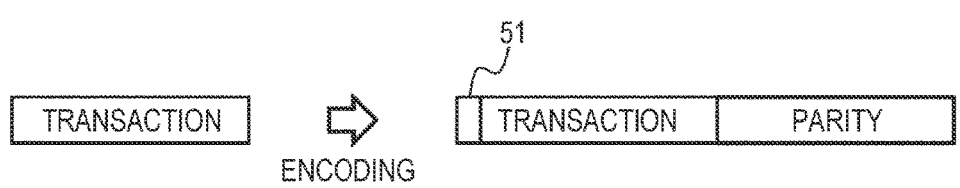
FIGS. 9A, 9B, and 9C are diagrams illustrating a specific example of encoding performed in a terminal device.
Figure 9B:
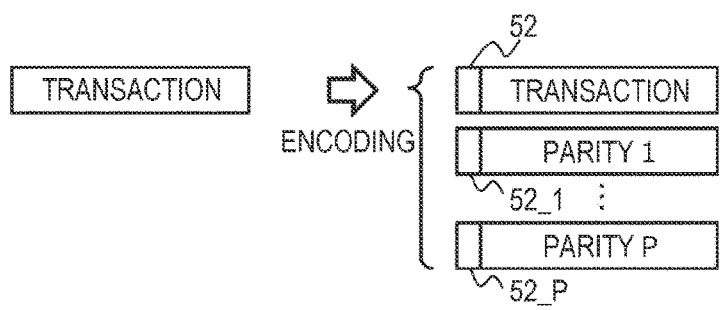
Figure 9C:
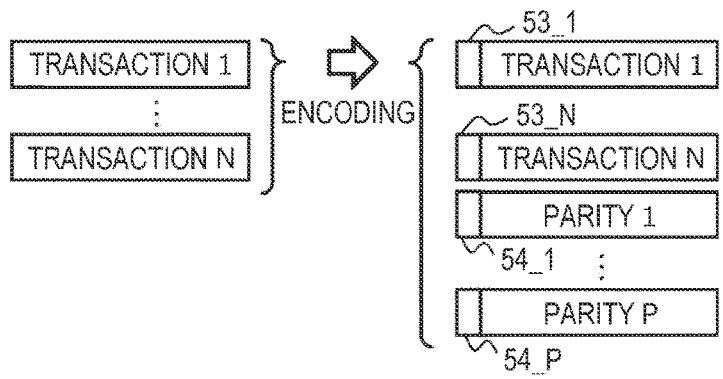

FIGS. 9A, 9B, and 9C illustrate specific examples of the encoding performed in the terminal device 101.

FIG. 9A illustrates an example of generating one encoded message from the transaction as an original message. A parity of a predetermined size is generated from the transaction as redundant data for restoring (correcting) an error. The parity is added to the end of the transaction, and encoding control information 51 is added to the head of the transaction. Thus, the encoded message is generated. The encoding control information 51, the transaction, and the parity are included in one encoded message. By the encoding, the message size increases by the encoding control information and the parity.

The encoding control information 51 stores an index indicating the order of the original message (transaction in this example), a time stamp, and the like. By using the parity, errors of some bits in the encoded message can be restored (corrected) on the reception side. The parity in this example is an error correction code for correcting a bit error. The parity may have a function of detecting an error. A cyclic redundancy check (CRC) bit sequence for detecting a bit error may be further added after the parity in the encoded message.

FIG. 9B illustrates an example of generating a plurality of encoded messages from the transaction as the original message. P (P is an integer of 2 or more) parities of a predetermined size are generated as redundant data from one transaction. Pieces of encoding control information 52 and 52_1 to 52_P are added to each of the transaction and the P parities. Thus, P+1 encoded messages of the encoded message including the transaction and the P encoded messages including the parity are obtained. The CRC (cyclic redundancy check) bit sequence for detecting a bit error may be further added after the parity in each encoded message.

The encoding control information 52 stores an index indicating the order of the original message (transaction in this example), the number (P) of encoded messages related to the parity, the total number (P+1) of encoded messages, a time stamp, and the like. The encoding control information 52_1 to 52_P stores a transaction index, an index indicating the order of parity, a time stamp, and the like. A part or all of the information stored in the encoding control information 52 may be stored in the encoding control information 52_1 to 52_P, or a part or all of the information stored in the encoding control information 52_1 to 52_P may be stored in the encoding control information 52. Other information may be stored in the encoding control information 52 and 52_1 to 52_P.

By using the parity, even in a case where the reception side fails to receive the encoded message including the transaction (for example, even in a case where the packet of the encoded message is lost or there is an error in the transaction), the transaction can be restored. The number of parities necessary for the restoration depends on the encoding system. The parity is an erasure correction code that restores a lost transaction.

FIG. 9C illustrates an example of generating a plurality of (N+P) encoded messages from N (N is an integer of 2 or more) transactions as original messages. P (P is an integer of 2 or more) parities (redundant data) of a predetermined size are generated from N transactions. Pieces of encoding control information 53_1 to 53_N and 54_1 to 54_P are respectively added to the N transactions and the P parities to obtain a plurality of (N+P) encoded messages. The CRC (cyclic redundancy check) bit sequence for detecting a bit error may be further added after the parity in each encoded message.

The encoding control information 53_1 to 53_N stores the number (N) of original messages, an index indicating the order of the original messages, the number (P) of parity messages, the number (N+P) of encoded messages, a time stamp, and the like. In the encoding control information 54_1 to 54_P, indexes of transactions 1 to N, indexes indicating the order of parity messages, time stamps, and the like are stored. A part or all of the information to be stored in the encoding control information 53_1 to 53_N may be stored in the encoding control information 54_1 to 54_P, or a part or all of the information to be stored in the encoding control information 54_1 to 54_P may be stored in the encoding control information 53_1 to 53_P. Other information may be stored in the encoding control information 53_1 to 53_N and 54_1 to 54_P.

At the time of transmission, for example, the encoded messages of the transactions are continuously transmitted in the order of indexes, and the encoded messages of the parity are continuously transmitted in the order of indexes of the parity. By using the parity, the reception side can restore the transaction even when the encoded message including the transaction is lost in the middle (even in a case where the packet of the encoded message is lost or in a case where there is an error in the bit of the transaction). The number of original messages (transactions) that can be recovered, the number of parities necessary for recovery, and the like depend on an encoding system.

Figure 10:
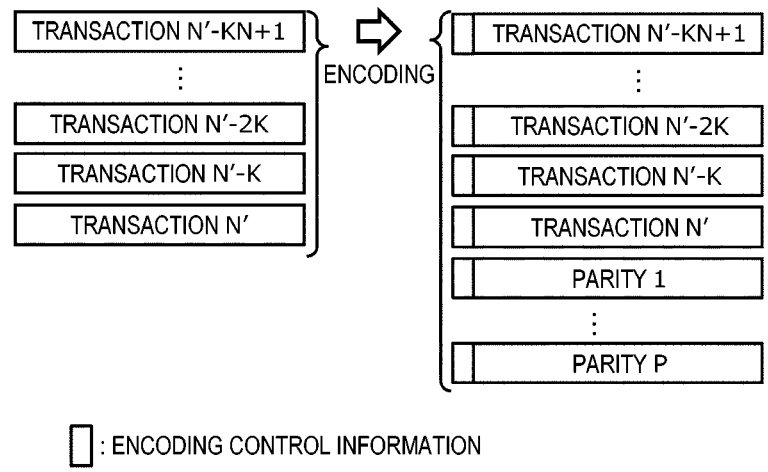
FIG. 10 is a diagram illustrating a variation of processing of generating a plurality of encoded messages from a plurality of transactions.

FIG. 10 illustrates a variation in a case where a plurality of encoded messages is generated from a plurality of transactions illustrated in FIG. 9C. In the example of FIG. 9C, a plurality of transactions of consecutive indexes 1 to N is used. In this case, there is an advantage that the waiting time can be shortened at the time of encoding and decoding. On the other hand, in the example of FIG. 10, transactions of non-continuous indexes are selected. Specifically, N transactions are selected every K transactions from consecutive index transactions. P parities are generated from the selected N transactions. At the time of transmission, for example, the encoded messages of the transactions are transmitted in the order of original indexes. The parity encoded messages are continuously transmitted in the order of indexes of the parity. By generating the parity using discontinuous transactions in this manner, the possibility that the transactions can be decoded is improved even if the communication quality becomes unstable and a burst error occurs.

Figure 11:
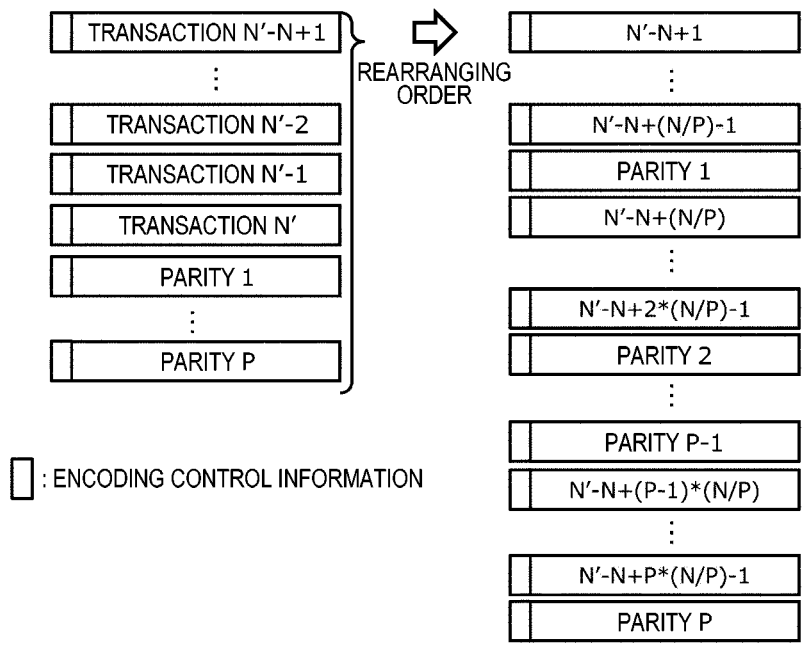
FIG. 11 is a view illustrating a variation of a transmission order of a plurality of encoded messages.

FIG. 11 illustrates a variation of the transmission order of the plurality of encoded messages generated by the encoding method in FIG. 9C. In an example of FIG. 11, the encoded messages of the parity are inserted at equal intervals and transmitted in the middle of transmission of the encoded messages of the transactions. Specifically, P parity encoded messages (parity packets) are transmitted at equal intervals with respect to the encoded messages (transaction packets) of the N transactions. The left part of the drawing illustrates N transaction packets and P parity packets generated by encoding, and the right part of the drawing illustrates an example in which P parity packets are placed at equal intervals in N transaction packets. By transmitting the transaction packet and the parity packet in the rearranged order as described above, the possibility that the transactions can be decoded in a case where the communication quality becomes unstable and a burst error occurs is further improved.

In the example of FIG. 11, the parity packets are inserted at equal intervals with respect to the transaction packet, but it is also possible to insert the parity packets at unequal intervals and transmit the parity packets. Furthermore, even in a case where parity packets are inserted at equal intervals, when N is a value that cannot be divided by P, it is also possible to insert parity packets at unequal intervals at specific locations.

Hereinafter, an example of decoding processing in the terminal device 101 will be described with reference to FIGS. 12 to 14. This example illustrates an example in which a transaction is acquired by decoding, but the same applies to other data such as approval data.

Figure 12:
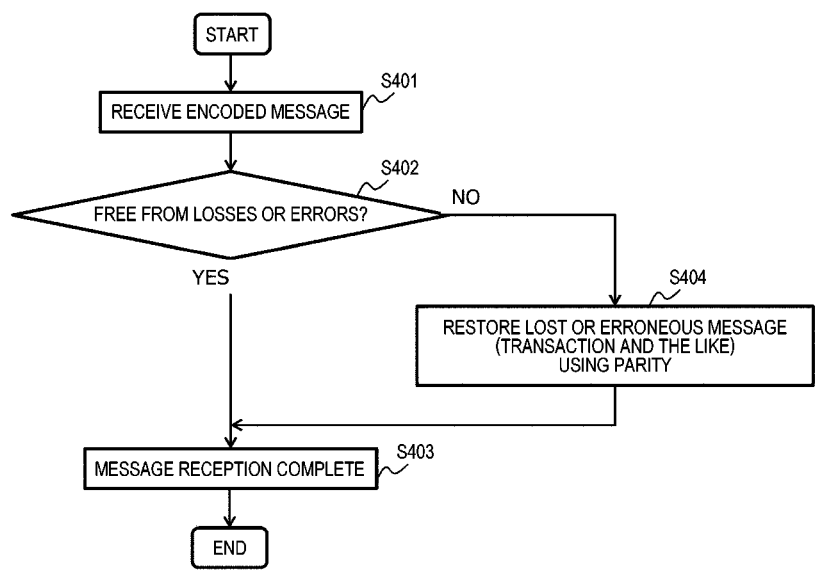
FIG. 12 is a flowchart illustrating an example of decoding processing in the terminal device.

FIG. 12 is a flowchart illustrating an example of decoding processing in the terminal device 101. The terminal device 101 receives one or more encoded messages related to the transaction via the communication network 102 (S401). On the basis of the received encoded message, it is determined whether it is free from losses or errors of the message (transaction in this example) (S402). Whether or not there is an error is determined using an error detection code such as the CRC as an example. Details of the determination as to whether or not there is a message loss will be described later.

In a case where there is no loss or error in the message (YES), the reception of the message is completed (S403). That is, the message is successfully received.

On the other hand, in a case where there is an error in the message (NO), error correction (in a case of FIG. 9A) or erasure correction (case of FIGS. 9B and 9C) is performed using the parity to restore the message (S404). When the message is recovered, the recovered message is acquired. Thus, the reception of the message is completed (S403).

Furthermore, in a case where there is a loss of the message (NO), erasure correction (case of FIGS. 9B and 9C) is performed using the parity to restore the message (S404). Thus, the reception of the message is completed (S403).

Figure 13:
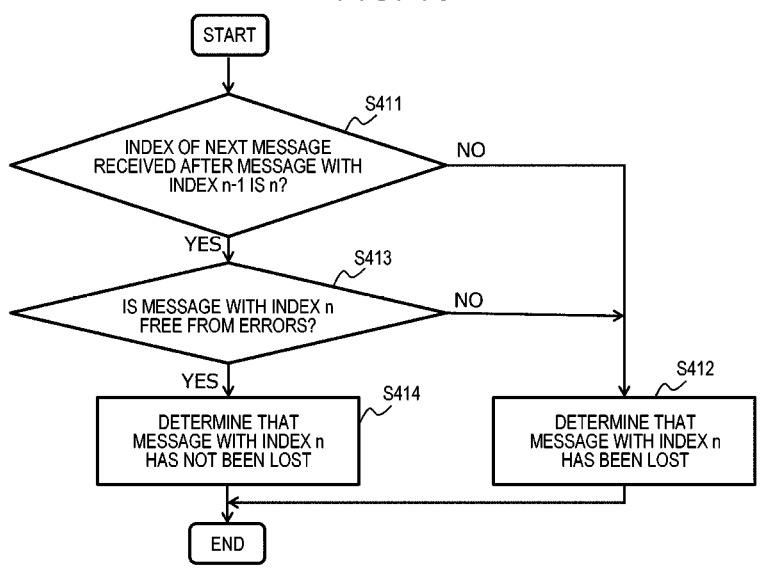
FIG. 13 is a flowchart illustrating a first example of processing of determining whether there is a message loss.

FIG. 13 is a flowchart illustrating a first example of processing of determining whether there is a message loss performed in step S402 in FIG. 12.

The terminal device 101 determines whether the index of the message (transaction in this example) is continuous with the index of the previously received message (S411). Specifically, it is determined whether an index of a message received next to a message with an index n−1 is n.

In a case where the index of the message received next after the message with the index n−1 is not n, it is determined that the message with the index n has been lost (S412).

In a case where the index of the message received next after the message with the index n−1 is n, it is determined whether or not the message with the index n is free from errors on the basis of the error detection code such as the CRC (S413). In a case where there is an error, it is determined that the message with the index n has been lost (S412). In a case where there is no error, it is determined that the message with the index n has not been lost (S414).

Figure 14:
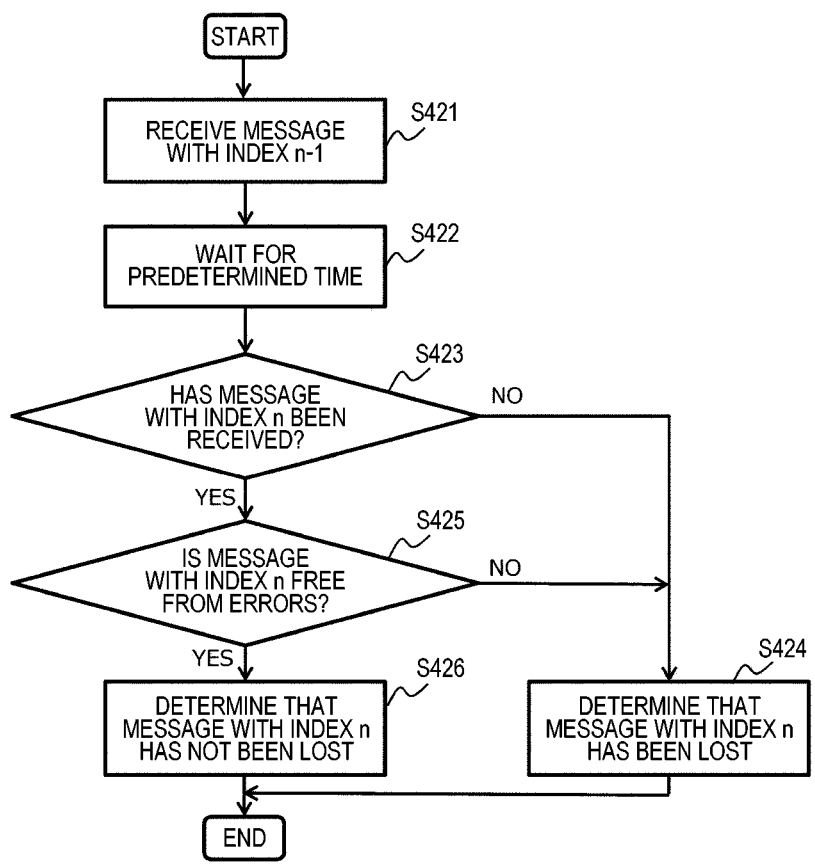
FIG. 14 is a flowchart illustrating a second example of the processing of determining whether there is a message loss.

FIG. 14 is a flowchart illustrating a second example of the processing of determining whether there is a message loss performed in step S402 of FIG. 12.

After receiving the message (transaction in this example), the terminal device 101 waits for a predetermined time (S421 and S422). It is determined whether a message with the next index has been received within the predetermined time (S423). That is, it is determined whether the message with the index n which is consecutive to the index n−1 of the previously received message has been received within the predetermined time from the reception of the message with the index n−1. By waiting for the predetermined time, it is possible to cope with a case where the message arrives differently from the order of indexes.

In a case where the message with the index n is not received within the predetermined time, it is determined that the message with the index n has been lost (S424).

In a case where the message with the index n is received within the predetermined time, whether or not the message with the index n is free from errors is determined on the basis of the error detection code such as the CRC (S425). In a case where there is an error, it is determined that the message with the index n has been lost (S424). In a case where there is no error, it is determined that the message with the index n has not been lost (S426).

Figure 15:
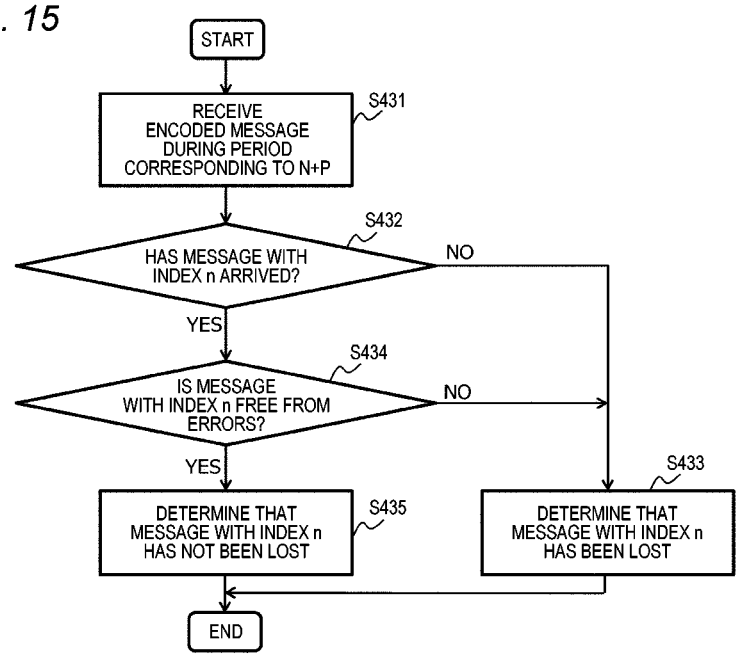
FIG. 15 is a flowchart illustrating a third example of the processing of determining whether there is a message loss.

FIG. 15 is a flowchart illustrating a third example of the processing of determining whether there is a message loss performed in step S402 of FIG. 12.

The terminal device 101 waits for reception of encoded messages during a period corresponding to N+P encoded messages (S431). N is the number of encoded messages including a transaction, and P is the number of encoded messages including a parity (see FIG. 9C).

The terminal device 101 determines whether each of the messages of N transactions (assumed to be the message of the index n) to be received in the period is received on the basis of the encoded message received in the period (S432). In a case where there is a message of the index n that has not been received, it is determined that the message of the index n has been lost (S433).

In a case where the message with the index n has been received, whether or not the message with the index n is free from errors is determined on the basis of the error detection code such as the CRC (S434). In a case where there is an error, it is determined that the message with the index n has been lost (S433). In a case where there is no error, it is determined that the message with the index n has not been lost (S435).

As described above, according to the present embodiment, since broadcast or multicast can be stably executed even in a network in which the radio wave environment is unstable, the blockchain can be stably operated. In the blockchain in the related art, error detection or error correction at a bit level in a lower layer is performed in a communication network, but in a case where a message itself including application data (transaction, approval data, and the like) does not arrive, the message has not been retransmitted. Thus, the blockchain is divided in a node to which the message does not arrive. In this case, for example, the longest blockchain is employed by the consensus algorithm, and information of the longest blockchain is acquired from another node in the node. On the other hand, in the present embodiment, lost data or erroneous data can be restored using the parity. Therefore, it is possible to increase the possibility of successfully receiving data even if there is data loss or error, reduce the possibility of blockchain segmentation, or avoid blockchain segmentation. An opportunity to acquire the information of the longest blockchain from another node is reduced, and the overall processing amount in the blockchain system can be reduced.

(Modification 1)

The encoding method or strength of encoding may be changed depending on the type of data (transaction, approval request, approval data, and the like). For example, as the value of P is increased, the strength of encoding can be increased.

Furthermore, any one of the transaction, the approval request, and the approval data may be the target of encoding and decoding, and the others may not be the target of encoding and decoding. For example, the transaction may be encoded, but the approval request and the approval data may not be encoded. The transaction is a material necessary for each terminal device to correctly complete approval. Therefore, it is effective to encode the transaction particularly in a case where there is a request for stably exchanging the transaction.

Furthermore, for example, the transaction may not be encoded, but the approval request or the approval data may be encoded. Since it is the approved block that remains as the blockchain, it is effective to encode the approval request or the approval data particularly in a case where there is a request for stably exchanging the approval request or the approval data.

(Modification 2) In a case where N encoded messages including a transaction and P encoded messages including a parity are generated as illustrated in FIG. 9C, some encoded messages may be thinned (punctured) according to a decoding capability of the parity (erasure correction code). In this case, a remaining encoded message after puncturing is sent, and a punctured encoded message is not sent. Thus, the amount of data to be transmitted can be compressed.

Figure 16:
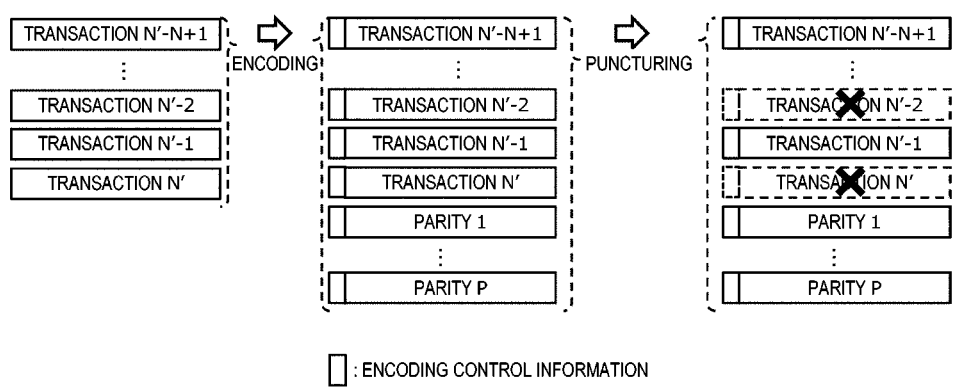
FIG. 16 is a diagram illustrating an example of puncturing.

FIG. 16 is a diagram illustrating an example of puncturing in Modification 2. From the N transactions, N encoded messages including the transaction and P encoded messages including the parity are generated. M encoded messages are punctured from the N+P encoded messages. In the example of the drawing, the encoded message including the transaction N', the encoded message including the transaction N'−2, and the like are punctured. Remaining N+P−M encoded messages obtained by puncturing the M encoded messages are transmitted (broadcast or multicast). In the example of FIG. 16, the encoded message to be punctured is the encoded message including the transaction, but the encoded message including the parity may be punctured. Both the encoded message including the transaction and the encoded message including the parity may be punctured.

A rough indication of the relationship among M, P, and N is as follows as an example. The following relationship depends on the encoding method used. The values of M, P, and N are only required to be appropriately determined according to the encoding system to be used.

Examples of indication of P: $P>N*(Pe+0.1)$

Examples of indication of M: $M<(N+P)*Pe$, or $M<(N+P)(P/N-0.1)Pe (0<=Pe<=1)$: ratio of recoverable messages (Modification 3)

In the embodiment described above, it is assumed a case where encoding and decoding are performed in the application layer, but the encoding and decoding can be performed in other layers. The encoding and decoding may be performed in the transport layer, the data link layer (for example, the RLC layer), or the physical layer illustrated in FIG. 3 described above. Furthermore, the encoding and decoding may be performed in two or more layers of the application layer, the transport layer, the data link layer, and the physical layer. In particular, the encoding in the transport layer is effective as in the application layer. In any case, the encoding and decoding can be performed between a plurality of terminal devices.

Furthermore, the encoding and decoding can be performed between the terminal device and the base station. In this case, for example, the encoding and decoding can be performed in at least one of the data link layer or the physical layer. The base station may include the information processing device according to the present embodiment. However, the base station functions not as a node participating in the blockchain but as a relay station that relays messages transmitted and received between terminal devices. The encoding and decoding processing between the base station and the terminal device may be similar to the encoding and decoding between the terminal devices. As described above, encoding and decoding according to the present embodiment can be performed between the base station and the terminal device.

(Modification 4)

In the above-described embodiment, the transaction or the like is stored in a block constituting the blockchain, but an encoded message including the transaction and an encoded message including the parity may be stored. For example, in a case where N encoded messages including a transaction and P encoded messages including a parity are generated from N transactions, the N encoded messages and the P encoded messages are stored in the block. That is, a block to be added to the blockchain is generated using both the transaction and the parity generated by the encoding as the original message. Thus, for example, in a case where a terminal device of a participant who newly participates in the blockchain system acquires the information of the blockchain from another terminal device, it can be expected that an effect of packet recovery (recovery of lost transaction) by erasure correction can be obtained. On the other hand, in a case where the encoded message including the parity is not stored in the block as in the above-described embodiment, the size of the entire blockchain can be kept small.

A use case example of the blockchain system according to the present embodiment will be described.

(Map Management)

The blockchain system according to the present embodiment can be used in a case where a map is shared among a plurality of users. As an example, an electronic device mounted on a mobile object such as an automobile or an airplane, an electronic device held by a pedestrian, a database device (server) disposed on the Internet, or the like is used as the terminal device 101 (information processing device) in FIG. 1. The electronic device mounted on a mobile object, the electronic device held by a pedestrian, and the database device generate a transaction and broadcast or multicast the transaction to a blockchain system.

Examples of the transaction generated by the electronic device and the database device include position information, a time stamp, a moving image and audio of a camera, a building name, a shop name, and a category (for example, a restaurant, a retail store, a hospital, or the like).

A certain node of the electronic device and the database device collects a transaction from the blockchain system and generates a block including the collected transaction. Approval of the generated block is acquired on the basis of the consensus algorithm, and the approval data including information regarding the approved block is broadcast or multicast. The other node receives the broadcast or multicast approval data and adds the approved block to the blockchain. Thus, the electronic device and the database device can share the map and update the map.

(Driving Instruction/Record)

The blockchain system according to the present embodiment can be used to provide auxiliary information for issuing driving (including automated driving) instructions to a mobile object such as a vehicle or an airplane. Furthermore, the blockchain system can be used to record data for verification at the time of occurrence of a failure or an accident of a mobile object such as a vehicle or for determining whether or not insurance can be applied.

As an example, an electronic device mounted on a mobile object, a database device (server) disposed on the Internet, or the like is used as the terminal device 101 (information processing device) in FIG. 1. The electronic device and the database device mounted on the mobile object generate a transaction and broadcast or multicast the transaction to the blockchain system.

Examples of the transaction generated by the electronic device and the database device include position information, a time stamp, a vehicle type and a maintenance situation, a moving image and sound of an in-vehicle camera, a detection result of an in-vehicle radar, a driving operation history (including a case of automated driving) such as an accelerator and a brake, a state of a driver, and the like.

A certain node of the electronic device and the database device collects a transaction from the blockchain system and generates a block including the collected transaction. Approval of the generated block is acquired on the basis of the consensus algorithm, and the approval data including information regarding the approved block is broadcast or multicast. The other node receives the broadcast or multicast approval data and adds the approved block to the blockchain. Thus, the electronic device or the database device can generate a driving instruction using the information registered in the blockchain as the auxiliary information and transmit the generated instruction to the mobile object or the driver. Furthermore, in a case where a failure or an accident of the mobile object occurs, information registered in the blockchain can be used in order to verify the failure or the accident and determine whether or not the insurance can be applied.

(Task Management of Robot)

The blockchain system according to the present embodiment can be used for task management of a plurality of robots operating in a facility such as a warehouse or a factory.

As an example, an electronic device mounted on a plurality of robots in a facility, a database device (server) disposed on the Internet, and the like are used as the terminal device 101 (information processing device) in FIG. 1. An electronic device and a database device mounted on the robot generate a transaction and broadcast or multicast the transaction to the blockchain system.

As an example of the transaction generated by the database device, there is a work instruction for the robot. Examples of the transaction generated by the electronic device mounted on the robot include work start, work status, work completion, and work report.

A certain node of the electronic device and the database device mounted on the robot collects a transaction from the blockchain system and generates a block including the collected transaction. Approval of the generated block is acquired on the basis of the consensus algorithm, and the approval data including information regarding the approved block is broadcast or multicast. The other node receives the broadcast or multicast approval data and adds the approved block to the blockchain. The information registered in the blockchain can be used for work management and inventory management by a plurality of robots. Furthermore, the information registered in the blockchain can be used to avoid duplication of work and work leakage among the plurality of robots. Thus, the work efficiency can be enhanced.

(Person Trace)

The blockchain system according to the present embodiment can be used for tracing a person such as tracking a criminal or an ex-convict.

As an example, an electronic device held by a person to be tracked, a sensing device installed in an environment in which the person to be tracked moves, a database device (server) arranged on the Internet, and the like are used as the terminal device 101 (information processing device) in FIG. 1.

Examples of the transaction generated by the electronic device held by the person to be tracked include position information, a time stamp, a behavior history, and the like. Examples of the transaction generated by the sensing device include position information, a time stamp, sensing data, and the like. Examples of the sensing data include a moving image, a voice, information for identifying a detected person, and information for identifying a detected object (for example, an object held by the detected person, or the like).

A node of the electronic device and the sensing device generates a transaction and broadcasts or multicasts the transaction to the blockchain system. The database device collects transactions from the blockchain system and generates a block including the collected transactions. Approval of the generated block is acquired on the basis of the consensus algorithm, and the approval data including information regarding the approved block is broadcast or multicast. The other node (for example, a database device) receives the broadcast or multicast approval data and adds the approved block to the blockchain. The information registered in the blockchain can be used for tracing a person. In this example, the node holding the blockchain is only the database device, but at least one of the electronic device and the sensing device may also hold the blockchain.

(Others)

Other data examples that can be the target data of the blockchain system according to the present embodiment will be listed below.

Financial transaction (stocks, unpublished stocks, crowdfunding, credits, mutual funds, derivatives, pension insurance, pensions, and the like)

Public information (real estate registration, automobile registration, two-wheeled vehicle registration, bicycle registration, business registration, marriage certificate, death certificate, and the like)

ID (driver's license, ID card, passport, voter registration, and the like)

Private sector (a private bond, a loan, a contract, a game, a signature, a will, a trust, and the like)

Proof (insurance certificate, proof of possession, notarization, and the like)

Key (home, hotel, rental car, automobile use, and the like)

Intangibles (patents, trademarks, copyrights, reservations, domain names, and the like)

Transaction (escrow transaction, secured transaction, third-party arbitration, multiple transaction, and the like)

(Hardware Configuration)

Figure 17:
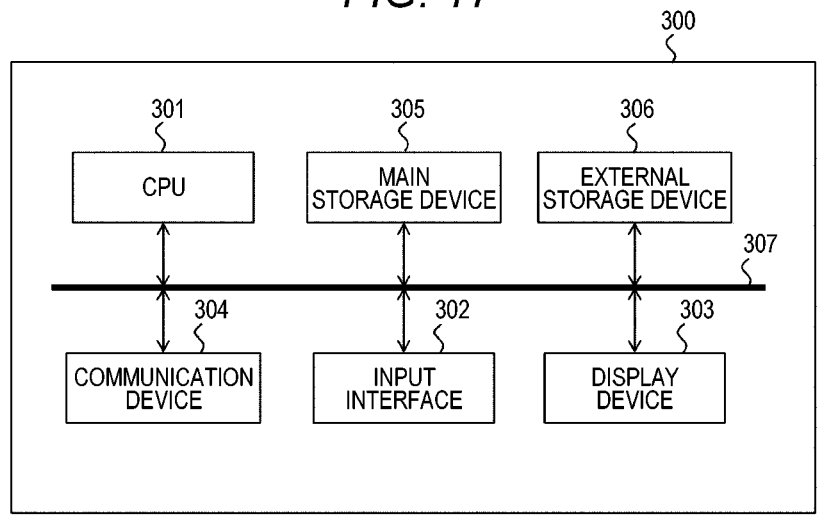
FIG. 17 is a hardware block diagram of the information processing device according to the embodiment of the present disclosure.

FIG. 17 illustrates an example of a hardware configuration of the information processing device according to the present embodiment. The information processing device included in the terminal device 101 includes a computer device 300. The computer device 300 includes a CPU 301, an input interface 302, a display device 303, a communication device 304, a main storage device 305, and an external storage device 306, which are connected to each other via a bus 307. The information processing device included in the base station 103 also has a configuration similar to that of the terminal device 101.

A central processing unit (CPU) 301 executes a computer program on a main storage device 305. The computer program is a program that achieves each of the above-described functional configurations of the information processing device. The computer program may be achieved not by one program but by a combination of a plurality of programs and scripts. The CPU 301 executes the computer program to implement each functional configuration.

The input interface 302 is a circuit for inputting an operation signal from an input device such as a keyboard, a mouse, and a touch panel to the information processing device.

The display device 303 displays data stored in the information processing device or data calculated by the information processing device. The display device 303 is, for example, a liquid crystal display (LCD), an organic electroluminescence display, a cathode ray tube (CRT), or a plasma display (PDP), but is not limited thereto.

The communication device 304 is a circuit for the information processing device to communicate with an external device by wire or wirelessly. Data used in the information processing device can be input from the external device via the communication device 304. The communication device 304 includes an antenna. Data input from the external device can be stored in the main storage device 305 or the external storage device 306.

The main storage device 305 stores a computer program, data necessary for execution of the computer program, data generated by execution of the computer program, and the like. The computer program is developed and executed on the main storage device 305. The main storage device 305 is, for example, RAM, DRAM, or SRAM, but is not limited thereto. The storage unit in FIG. 5 may be constructed on the main storage device 305.

The external storage device 306 stores a computer program, data necessary for execution of the computer program, data generated by execution of the computer program, and the like. These computer programs and data are read into the main storage device 305 when the computer program is executed. Examples of the external storage device 306 include a hard disk, an optical disk, a flash memory, and a magnetic tape, but are not limited thereto. The storage unit in FIG. 5 may be constructed on the external storage device 306.

Note that the computer program may be installed in the computer device 300 in advance or may be stored in a storage medium such as a CD-ROM. Furthermore, the computer program may be uploaded on the Internet.

Furthermore, the computer device 300 may be configured as a single device, or may be configured as a system including a plurality of computer devices connected to each other.

Note that the above-described embodiments illustrate examples for embodying the present disclosure, and the present disclosure can be implemented in various other forms. For example, various modifications, substitutions, omissions, or combinations thereof can be made without departing from the gist of the present disclosure. Such modifications, substitutions, omissions, and the like are also included in the scope of the present disclosure and are similarly included in the invention described in the claims and the equivalent scopes thereof.

Furthermore, the effects of the present disclosure described in the present description are merely examples, and other effects may be provided.

Note that the present disclosure can also employ the following configurations.

[Item 1]

An information processing device, including:

an encoding unit that generates redundant data of target data by encoding the target data; and a communication unit that broadcasts or multicasts the target data and the redundant data to a distributed network that manages the target data in a distributed manner by a plurality of devices.

[Item 2]

The information processing device according to item 1, in which the encoding unit encodes the target data in an application layer or a transport layer.

[Item 3]

The information processing device according to item 1 or 2, in which the target data is data generated by an application of a blockchain.

[Item 4]

The information processing device according to item 3, in which the target data is a transaction of the blockchain.

[Item 5]

The information processing device according to item 3, in which the target data is an approval request or approval data of a block in the blockchain.

[Item 6]

The information processing device according to any one of items 1 to 5, in which the encoding unit changes a type of a code used in the encoding according to a type of the target data.

[Item 7]

The information processing device according to any one of items 1 to 6, in which the encoding unit changes a number of the redundant data according to a type of the target data.

[Item 8]

The information processing device according to any one of items 1 to 7, in which the encoding unit switches execution/non-execution of the encoding according to a type of the target data.

[Item 9]

The information processing device according to any one of items 1 to 8, in which the encoding unit generates a plurality of pieces of the redundant data on the basis of the target data.

[Item 10]

The information processing device according to any one of items 1 to 9, in which the encoding unit generates a plurality of pieces of the redundant data on the basis of a plurality of pieces of the target data.

[Item 11]

The information processing device according to any one of items 1 to 10, in which the encoding unit thins the target data, a number of which is equal to or less than a number of pieces of target data that is capable of being restored on the basis of a plurality of pieces of the redundant data, from the plurality of pieces of the target data, and the communication unit transmits the target data remaining after the thinning and does not transmit the thinned target data.

[Item 12]

The information processing device according to any one of items 1 to 11, in which the encoding unit selects a plurality of pieces of non-consecutive target data from a plurality of pieces of the target data arranged in a first order, and generates a plurality of pieces of the redundant data on the basis of the plurality of pieces of the non-consecutive target data, and the communication unit transmits the plurality of pieces of the target data in the first order and transmits the plurality of pieces of the redundant data.

[Item 13]

The information processing device according to any one of items 1 to 12, in which the communication unit transmits a message including the target data and the redundant data.

[Item 14]

The information processing device according to any one of items 1 to 13, in which the communication unit transmits a first message including the target data and a second message including the redundant data.

[Item 15]

The information processing device according to any one of items 1 to 14, in which the communication unit receives target data generated by the device from the distributed network and redundant data for the target data, and the information processing device further includes a processing unit that adds a block including the target data received and the redundant data received to a blockchain.

[Item 16]

An information processing method, including:

generating redundant data of target data by encoding the target data; and broadcasting or multicasting the target data and the redundant data to a distributed network that manages the target data in a distributed manner by a plurality of devices.

[Item 17]

A computer program for causing a computer to execute:

generating redundant data of target data by encoding the target data; and broadcasting or multicasting the target data and the redundant data to a distributed network that manages the target data in a distributed manner by a plurality of devices.

[Item 18]

An information processing system, including:

a first information processing device including an encoding unit that generates redundant data of target data by encoding the target data, and a communication unit that broadcasts or multicasts the target data and the redundant data to a distributed network that manages the target data in a distributed manner by a plurality of devices; and a second information processing device including a receiving unit that receives the target data and the redundant data from the distributed network, and a decoding unit that restores the target data on the basis of the redundant data in a case where the target data is lost or in a case where an error is detected in the target data.

REFERENCE SIGNS LIST

10 Antenna
11 Communication unit
12 Encoding unit
13 Decoding unit
14 Processing unit 15 Storage unit
100 Distributed network
101A to 101E Terminal device
102 Communication network
103A, 103B Base station
300 Computer device
301 CPU
302 Input interface
303 Display device
304 Communication device
305 Main storage device
306 External storage device
307 Bus

The invention claimed is:

1. An information processing device, comprising:
an encoding unit that generates redundant data of target data by encoding the target data; and
a communication unit that broadcasts or multicasts the target data and the redundant data to a distributed network that manages the target data in a distributed manner by a plurality of devices.

2. The information processing device according to claim 1, wherein
the encoding unit encodes the target data in an application layer or a transport layer.

3. The information processing device according to claim 1, wherein
the target data is data generated by an application of a blockchain.

4. The information processing device according to claim 3, wherein
the target data is a transaction of the blockchain.

5. The information processing device according to claim 3, wherein
the target data is an approval request or approval data of a block in the blockchain.

6. The information processing device according to claim 1, wherein the encoding unit changes a type of a code used in the encoding based on a type of the target data.

7. The information processing device according to claim 1, wherein
the encoding unit changes a number of the redundant data according to a type of the target data.

8. The information processing device according to claim 1, wherein the encoding unit switches one of execution or non-execution of the encoding according to a type of the target data.

9. The information processing device according to claim 1, wherein the encoding unit generates a plurality of pieces of the redundant data based on the target data.

10. The information processing device according to claim 1, wherein
the encoding unit generates a plurality of pieces of the redundant data on a basis of a plurality of pieces of the target data.

11. The information processing device according to claim 1, wherein
the encoding unit thins the target data, a number of which is equal to or less than a number of pieces of target data that is capable of being restored on a basis of a plurality of pieces of the redundant data, from the plurality of pieces of the target data, and
the communication unit transmits the target data remaining after the thinning and does not transmit the thinned target data.

12. The information processing device according to claim 1, wherein
the encoding unit selects a plurality of pieces of non-consecutive target data from a plurality of pieces of the target data arranged in a first order, and generates a plurality of pieces of the redundant data on a basis of the plurality of pieces of the non-consecutive target data, and
the communication unit transmits the plurality of pieces of the target data in the first order and transmits the plurality of pieces of the redundant data.

13. The information processing device according to claim 1, wherein
the communication unit transmits a message including the target data and the redundant data.

14. The information processing device according to claim 1, wherein
the communication unit transmits a first message including the target data and a second message including the redundant data.

15. The information processing device according to claim 1, wherein
the communication unit receives target data generated by a device from the distributed network and redundant data of the target data, and
the information processing device further comprises a processing unit that adds a block including the received target data and the received redundant data to a blockchain.

16. An information processing method, comprising:
generating redundant data of target data by encoding the target data; and
broadcasting or multicasting the target data and the redundant data to a distributed network that manages the target data in a distributed manner by a plurality of devices.

17. A non-transitory computer-readable medium having stored thereon, computer-executable instructions which, when executed by a computer, cause the computer to execute operations, the operations comprising:
generating redundant data of target data by encoding the target data; and
broadcasting or multicasting the target data and the redundant data to a distributed network that manages the target data in a distributed manner by a plurality of devices.

18. An information processing system, comprising:
a first information processing device including an encoding unit that generates redundant data of target data by encoding the target data, and a communication unit that broadcasts or multicasts the target data and the redundant data to a distributed network that manages the target data in a distributed manner by a plurality of devices; and
a second information processing device including a receiving unit that receives the target data and the redundant data from the distributed network, and a decoding unit that restores the target data on a basis of the redundant data in a case where the target data is lost or in a case where an error is detected in the target data.

* * * * *